United States Patent
Nakada

(10) Patent No.: US 10,749,628 B2
(45) Date of Patent: Aug. 18, 2020

(54) TERMINAL APPARATUS, CONTROL METHOD THEREFOR, AND RECORDING MEDIUM IN WHICH CONTROL PROGRAM FOR TERMINAL APPARATUS IS STORED

(71) Applicant: NEC Corporation, Minato-ku, Tokyo (JP)

(72) Inventor: Tatsuhiro Nakada, Tokyo (JP)

(73) Assignee: NEC CORPORATION, Tokyo (JP)

( * ) Notice: Subject to any disclaimer, the term of this patent is extended or adjusted under 35 U.S.C. 154(b) by 48 days.

(21) Appl. No.: 15/757,706

(22) PCT Filed: Sep. 16, 2016

(86) PCT No.: PCT/JP2016/004243
§ 371 (c)(1),
(2) Date: Mar. 6, 2018

(87) PCT Pub. No.: WO2017/047093
PCT Pub. Date: Mar. 23, 2017

(65) Prior Publication Data
US 2019/0044651 A1    Feb. 7, 2019

(30) Foreign Application Priority Data

Sep. 17, 2015 (JP) .................... 2015-183657

(51) Int. Cl.
*H04L 1/14* (2006.01)
*H04L 1/00* (2006.01)
*H03M 13/29* (2006.01)

(52) U.S. Cl.
CPC ...... *H04L 1/0041* (2013.01); *H03M 13/2906* (2013.01); *H04L 1/00* (2013.01); *H04L 1/0009* (2013.01); *H04L 1/0075* (2013.01)

(58) Field of Classification Search
None
See application file for complete search history.

(56) References Cited

U.S. PATENT DOCUMENTS

2001/0008556 A1    7/2001    Bauer et al.
2004/0095950 A1    5/2004    Shirogane et al.
(Continued)

FOREIGN PATENT DOCUMENTS

AU    7372196 A    4/1997
CN    1809981 A    7/2006
(Continued)

OTHER PUBLICATIONS

Extended European Search Report for EP Application No. EP16845967.5 dated Aug. 16, 2018.
(Continued)

*Primary Examiner* — Mujtaba M Chaudry

(57) ABSTRACT

A terminal apparatus (1) is provided with a coding unit (7), a decoding unit (2), and a control unit (5) for controlling the coding unit and the decoding unit individually. Under control of the control unit, the coding unit codes a payload, a first number of error corrections (3), and identification information (6) that are to be transmitted, on the basis of a method indicated by the already-transmitted identification information to thereby generate first coded data. The decoding unit decodes newly-received second coded data on the basis of a method indicated by the identification information included in a decoding result of the already-received second coded data.

10 Claims, 8 Drawing Sheets

(56) References Cited

U.S. PATENT DOCUMENTS

| | | |
|---|---|---|
| 2004/0213569 A1 | 10/2004 | Taga et al. |
| 2004/0260998 A1 | 12/2004 | Sutskover |
| 2005/0138524 A1 | 6/2005 | Cioffi |
| 2006/0222376 A1 | 10/2006 | Ouchi et al. |
| 2007/0077066 A1 | 4/2007 | Nakamoto |
| 2007/0177719 A1 | 8/2007 | Dei et al. |
| 2007/0186142 A1 | 8/2007 | Okazaki et al. |
| 2007/0198878 A1 | 8/2007 | Dei |
| 2007/0217559 A1* | 9/2007 | Stott .............. G11C 7/1051 375/355 |
| 2007/0286239 A1 | 12/2007 | Baggen et al. |
| 2008/0256421 A1 | 10/2008 | Gerstel et al. |
| 2010/0021158 A1* | 1/2010 | Kanno ............. H04L 1/1671 398/27 |
| 2013/0007553 A1 | 1/2013 | Nishida et al. |
| 2013/0311840 A1* | 11/2013 | Miyata ............. H04L 1/203 714/704 |
| 2014/0229799 A1 | 8/2014 | Hubris et al. |
| 2015/0227418 A1* | 8/2015 | Cai ............... G06F 11/1048 714/768 |
| 2015/0286528 A1* | 10/2015 | Cai ............... G06F 11/1004 714/763 |
| 2015/0296224 A1* | 10/2015 | Davis ............. H04N 19/154 375/240.26 |
| 2016/0013811 A1 | 1/2016 | Si et al. |
| 2016/0294508 A1 | 10/2016 | Takeuchi et al. |

FOREIGN PATENT DOCUMENTS

| | | |
|---|---|---|
| CN | 1906879 A | 1/2007 |
| CN | 1914922 A | 2/2007 |
| CN | 1969493 A | 5/2007 |
| CN | 101018107 A | 8/2007 |
| CN | 101192900 A | 6/2008 |
| CN | 101267280 A | 9/2008 |
| CN | 101414922 A | 4/2009 |
| CN | 101635610 A | 1/2010 |
| CN | 101854224 A | 10/2010 |
| CN | 103152126 B | 4/2015 |
| EP | 2109339 A1 | 10/2009 |
| JP | 2001-057573 | 2/2001 |
| JP | 2002-517130 A | 6/2002 |
| JP | 2003-224542 A | 8/2003 |
| JP | 2004-171206 | 6/2004 |
| JP | 2007-104008 A | 4/2007 |
| JP | 2010-278974 A | 12/2010 |
| JP | 2013-013030 A | 1/2013 |
| JP | 2013-150339 A | 8/2013 |
| JP | 2013-152604 A | 8/2013 |
| WO | 2005/002127 A1 | 1/2005 |
| WO | 2014/179937 A1 | 11/2014 |
| WO | 2015/072005 A1 | 5/2015 |

OTHER PUBLICATIONS

Japanese Office Action for JP Application No. 2017-540514 dated Aug. 28, 2018 with English Translation.
International Search Report for PCT Application No. PCT/JP2016/004243, dated Nov. 8, 2016.
English translation of Written opinion for PCT Application No. PCT/JP2016/004243.
Chinese Office Action for CN Application No. 201680054120 dated Mar. 24, 2020 with English Translation.

* cited by examiner

Fig. 6

- 61 CPU
- 62 MEMORY
- 63 DISC
- 64 READING APPARATUS OF NONVOLATILE RECORDING MEDIUM
- 65 COMMUNICATION LINE
- 66 OUTPUT APPARATUS
- 67 INTERFACE
- 68 INPUT APPARATUS
- 60 INFORMATION PROCESSING APPARATUS

TERMINAL APPARATUS, CONTROL METHOD THEREFOR, AND RECORDING MEDIUM IN WHICH CONTROL PROGRAM FOR TERMINAL APPARATUS IS STORED

This application is a National Stage Entry of PCT/JP2016/004243 filed on Sep. 16, 2016, which claims priority from Japanese Patent Application 2015-183657 filed on Sep. 17, 2015, the contents of all of which are incorporated herein by reference, in their entirety.

TECHNICAL FIELD

The present invention relates to a technical field that controls an operation of a terminal apparatus disposed in a transmission path such as an optical communication line.

BACKGROUND ART

In recent years, with popularization of the Internet, a service that handles a content including large-capacity data such as a voice and a video is expanding, and therewith, a communication amount is rapidly increasing. In a communication line (hereinafter, abbreviated as a "line") facility which provides an Internet service that handles the large capacity content, an optical communication technique capable of performing, for example, broadband and long-distance communication is used.

In the line facility, electrical signals from various types of information processing devices such as servers that provide an Internet service are multiplexed by a terminal device and thereafter is subjected to electrical-optical conversion. An optically converted signal light is transmitted to an opposite terminal device, for example, via an optical fiber constituting a transmission path.

The opposite terminal device causes the transmitted signal light to be subjected to optical-electrical conversion and thereby acquires a multiplexed electrical signal. The multiplexed electric signal is demultiplexed into individual electrical signals, and the demultiplexed electrical signals are received by various types of information processing devices.

In the terminal device and transmission path, depending on a demand for a line, a new facility may be added to an existing facility by using, for example, an optical wavelength division multiplexing technique and the like. In this case, a change of transmission quality as described below may occur.

When, for example, a line facility is added, in a transmission path configuring the line facility, light of a wavelength used for an intended communication is affected by light of an adjacent wavelength. Thereby, transmission quality in the transmission path may degrade. In a transmission path configuring a line facility, by using a chance in which a line facility has been added, an adverse influence such as interference is not produced on light of a wavelength used for an intended communication, for example, by transfer of light of an adjacent wavelength to another wavelength, and thereby transmission quality in the transmission path may be improved. An element or the like that transmits light used between terminal devices deteriorates over time, and thereby transmission quality in the transmission path may decrease.

It is necessary for a line facility that provides an Internet service to maintain predetermined quality over a long term and continuously provide the Internet, even when a line situation as described above changes. Therefore, a terminal device using the optical communication technique needs to be designed in such a way as to be able to maintain predetermined transmission quality by expecting in advance, from a stage of introducing the terminal device, addition to a facility in the future and a change of a line situation due to aging of the facility. In the terminal device using the optical communication technique, in order to maintain transmission quality, generally, a forward error correction (hereinafter, abbreviated as an "FEC method") is used. The FEC method is one type of an error control method in data transmission and is a coding method in which, when coding data, a data transmitting side provides redundancy for the data, and thereby, without a request to the transmitting side for additional information, a receiving side detects and corrects an error of the data when decoding the data.

The above-described terminal device employs an FEC method (hereinafter, referred to also as a "coding method") having an ability (error correction ability) of correcting a detected error of data in order to ensure predetermined transmission quality. However, in the FEC method, when a modification of the above-described line facility and a change of a line situation due to an aging change are considered in advance and an FEC method having a high error correction ability is fixedly used, by contrast, transmission efficiency may decrease and a processing delay and power consumption in a terminal device may increase.

As one example of such a technique, PTL 1 discloses a technique in which a receiving side of a digital transmission system monitors quality of a reception signal and selects an FEC method depending on the quality of the monitored reception signal, and thereby an error correction method of the receiving side and a transmitting side is switched on the basis of the selected FEC method. The digital transmission system in PTL 1 notifies a transmitting side of a change of transmission quality on a receiving side in order to switch an error correction method, notifies the receiving side of a switching timing of an error correction method from the transmitting side, transmits an acknowledge (ACK) signal from the receiving side to the transmitting side, and switches the error correction method. The digital transmission system in PTL 1 previously supplies a power source and a clock also to an error correction circuit of a switching destination in such a way that data to be transmitted/received are not missing.

As a related technique, PTL 2 discloses a technique for suppressing a variation of an error correction ability for each optical reception device due to an individual difference in production and aging deterioration of an identifier for identifying an electrical signal obtained by converting a received optical signal, by an optical reception device.

PTL 3 discloses a technique for suppressing, when an optical transmission device is added with an optical transmission device having a high error correction ability, an optical power of an output signal of the added optical transmission device to a level lower than an optical power of an output signal of the existing optical transmission device and thereby expanding a transmission capacity at a low cost.

PTL 4 discloses a technique in which an occurrence situation analysis unit that analyzes a data error in a digital signal processing device determines a future error occurrence frequency on the basis of information about a current error occurrence situation and peripheral information acquired from an error correction processing unit and a peripheral information analysis unit.

CITATION LIST

Patent Literature

[PTL 1] Japanese Laid-open Patent Publication No. 2013-150339
[PTL 2] International Publication No. WO 2005/002127
[PTL 3] Japanese Laid-open Patent Publication No. 2003-224542
[PTL 4] Japanese Laid-open Patent Publication No. 2013-152604

SUMMARY OF INVENTION

Technical Problem

However, in the above-described technique described in PTL 1, in order to switch an error correction method, it takes time to transmit/receive various types of pieces of information between a transmitting side and a receiving side, and therefore there is a problem that the technique is not suitable for communication for transmitting data such as a voice and a video having high immediacy. In the technique described in PTL 1, a transmitting side and a receiving side need to be synchronized. In the technique described in PTL 1, in order to switch an error correction method without missing data, it is necessary to previously supply a power source and a clock to an error correction circuit of a switching destination. Therefore, in the technique described in PTL 1, it is necessary to additionally input data for a predetermined number of frames to an error correction circuit on a receiving side, and therefore there is a problem that a circuit size increases and control becomes complex.

Also in any of the techniques of PTLs 2 to 4, information regarding a number of error corrections of a local device, detected by a reception unit of the local device is not notified to an opposite device. As a result, in the techniques of PTLs 2 to 4, when an error correction ability of data transmitted from the opposite device is low, in data received by the reception unit of the local device, an error may continue to occur. In contrast, in the techniques of PTLs 2 to 4, when data transmitted by a transmission unit of the opposite device are coded with an error correction ability that is higher than needed, transmission efficiency may decrease.

A main object of the present invention is to provide a terminal apparatus and the like in which an error correction coding can be changed individually on a transmitting side and a receiving side with a simple configuration in such a way that an efficient and optimum transmission state is maintained even when transmission quality of a transmission path between terminal apparatuses changes.

Solution to Problem

In one aspect of the present invention, a terminal apparatus includes coding means for being capable of selecting any one of a plurality of types of error correction codings having error correction abilities different from one another, and generating first coded data to be transmitted from the terminal apparatus by executing coding by coding processing based on a selected error correction coding;

decoding means for being capable of selecting any one of the plurality of types of error correction codings having error correction abilities different from one another, and decoding second coded data received by the terminal apparatus by decoding processing based on a selected error correction coding; and control means for being capable of individually selecting any one of the error correction codings executed by the coding means and the decoding means among the plurality of types of error correction codings, and controlling the coding means and the decoding means individually, based on the selected error correction coding.

While the terminal apparatus and an opposite apparatus including a configuration similar to the terminal apparatus are transmittably and receivably connected to each other, the control means of the terminal apparatus controls the coding means of the terminal apparatus to generate the first coded data, the coding means coding, in accordance with coding processing based on the selected error correction coding to be executed this time,
 a payload to be transmitted this time by the terminal apparatus to the opposite apparatus,
 a first number of error corrections representing a number of times of error corrections counted when the decoding means of the terminal apparatus decodes the second coded data already received from the opposite apparatus, and
 identifier information for discriminating the error correction coding selected by the control means, to be employed for a payload to be transmitted next time to the opposite apparatus, controls the decoding means of the terminal apparatus to decode, when newly receiving the second coded data from the opposite apparatus in response to transmission of the first coded data by the terminal apparatus, the newly received second coded data by decoding processing based on the selected error correction coding indicated by the identifier information included in a decoding result of the already-received second coded data, controls the coding means of the terminal apparatus in such a way that a number of times of error corrections counted upon decoding is included as the first number of error corrections in the first coded data to be newly transmitted, and controls the coding means in such a way as to extract a second number of error corrections, being included in a decoding result, representing a number of times of error corrections counted when decoding means of the opposite apparatus decodes the first coded data already received from the terminal apparatus, select any one of error correction coding among the plurality of types of error correction codings depending on the extracted second number of error corrections, and generate the first coded data to be transmitted next time, by coding processing based on the selected error correction coding.

In addition, as another aspect of the present invention, a control method for a terminal apparatus, The terminal apparatus includes, coding means for being capable of selecting any one of a plurality of types of error correction codings having error correction abilities different from one another, and generating first coded data to be transmitted from the terminal apparatus by executing coding by coding processing based on a selected error correction coding; and decoding means for being capable of selecting any one of the plurality of types of error correction codings having error correction abilities different from one another, and decoding second coded data received by the terminal apparatus by decoding processing based on a selected error correction coding.

The control method includes:
being capable of individually selecting any one of the error correction codings executed by the coding means and the decoding means among the plurality of types of error correction codings;
while the terminal apparatus and the opposite apparatus that includes a configuration similar to the terminal apparatus are transmittably and receivably connected to each other, and when the coding means and the decoding means are individually controlled based on a selected error correction coding,
generating the first coded data by controlling the coding means of the terminal apparatus in such a way as to code, by coding, in accordance with coding processing based on the selected error correction coding to be executed this time,
  a payload to be transmitted this time by the terminal apparatus to an opposite apparatus,
  a first number of error corrections representing a number of times of error corrections counted when the decoding means of the terminal apparatus decodes the second coded data already received from the opposite apparatus, and
  identifier information for discriminating the error correction coding selected by the control means, to be employed for a payload to be transmitted next time to the opposite apparatus;
controlling the decoding means of the terminal apparatus in such a way as to decode, when newly receiving the second coded data from the opposite apparatus in response to transmission of the first coded data by the terminal apparatus, the newly received second coded data by decoding processing based on the selected error correction coding indicated by the identifier information included in a decoding result of the already-received second coded data;
controlling the coding means of the terminal apparatus in such a way that a number of times of error corrections counted upon decoding is included as the first number of error corrections in the first coded data to be newly transmitted; and
controlling the coding means in such a way as to extract a second number of error corrections, being included in a decoding result, representing a number of times of error corrections counted when decoding means of the opposite apparatus decodes the first coded data already received from the terminal apparatus, select any one of the error correction coding among the plurality of types of error correction codings depending on the extracted second number of error corrections, and generate the first coded data to be transmitted next time, by coding processing based on the selected error correction coding.

In addition, in another other aspect of the present invention, a computer-readable recording medium storing a control program of a terminal apparatus includes:
coding means for being capable of selecting any one of a plurality of types of error correction codings having error correction abilities different from one another, and generating first coded data to be transmitted from the terminal apparatus by executing coding by coding processing based on a selected error correction coding; and
decoding means for being capable of selecting any one of the plurality of types of error correction codings having error correction abilities different from one another, and decoding second coded data received by the terminal apparatus by decoding processing based on a selected error correction coding.

The control program causes computer of the terminal apparatus to execute processing of:
being capable of individually selecting any one of the error correction codings executed by the coding means and the decoding means among the plurality of types of error correction codings;
while the terminal apparatus and the opposite apparatus that includes a configuration similar to the terminal apparatus are transmittably and receivably connected to each other, and when the coding means and the decoding means are individually controlled by the control program, based on a selected error correction coding,
generating the first coded data by controlling the coding means of the terminal apparatus in such a way as to code, by coding, in accordance with coding processing based on the selected error correction coding to be executed this time,
  a payload to be transmitted this time by the terminal apparatus to an opposite apparatus,
  a first number of error corrections representing a number of times of error corrections counted when the decoding means of the terminal apparatus decodes the second coded data already received from the opposite apparatus, and
  identifier information for discriminating the error correction coding selected by the control means, to be employed for a payload to be transmitted next time to the opposite apparatus;
controlling the decoding means of the terminal apparatus in such a way as to decode, when newly receiving the second coded data from the opposite apparatus in response to transmission of the first coded data by the terminal apparatus, the newly received second coded data by decoding processing based on the selected error correction coding indicated by the identifier information included in a decoding result of the already-received second coded data;
controlling the coding means of the terminal apparatus in such a way that a number of times of error corrections counted upon decoding is included as the first number of error corrections in the first coded data to be newly transmitted; and
controlling the coding means in such a way as to extract a second number of error corrections, being included in a decoding result, representing a number of times of error corrections counted when decoding means of the opposite apparatus decodes the first coded data already received from the terminal apparatus, select any one of the error correction coding among the plurality of types of error correction codings depending on the extracted second number of error corrections, and generate the first coded data to be transmitted next time, by coding processing based on the selected error correction coding.

Advantageous Effects of Invention

In the present invention, there is an advantageous effect that, even when transmission quality of a transmission path between terminal apparatuses changes, an error correction coding can be changed individually on a transmitting side and a receiving side with a simple configuration in such a way that an efficient and optimum transmission state is maintained.

BRIEF DESCRIPTION OF DRAWINGS

FIG. 6 is a diagram schematically illustrating a hardware configuration of an information processing apparatus capable of achieving the terminal apparatuses according to the first example embodiment and the second example embodiment.

DESCRIPTION OF EMBODIMENTS

Next, example embodiments of the present invention will be described in detail with reference to drawings.

First Example Embodiment

Figure 1:
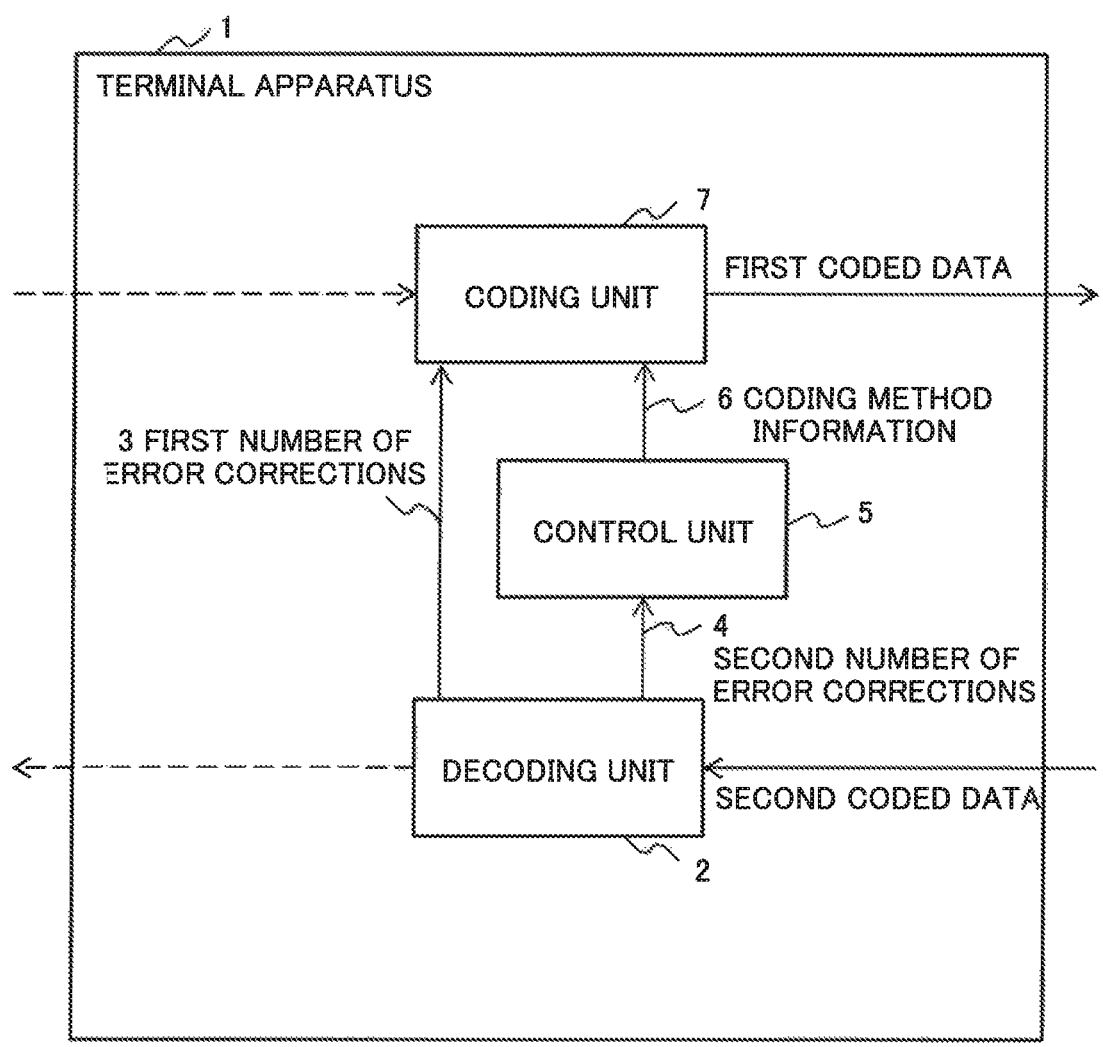
FIG. 1 is a block diagram illustrating a configuration of a terminal apparatus 1 according to a first example embodiment of the present invention.

First, a terminal apparatus 1 according to a first example embodiment as a basis of the present invention will be described. FIG. 1 is a block diagram illustrating a configuration of the terminal apparatus 1 according to the first example embodiment. Referring to FIG. 1, the terminal apparatus 1 according to the present example embodiment includes a decoding unit 2, a control unit 5, and a coding unit 7.

In the terminal apparatus 1, the coding unit 7 can execute a plurality of types of error correction codings (coding methods) having error correction abilities different from each other and can select any one of error correction codings to be executed among these error correction codings.

In general, in an error correction coding method, when on a transmitting side of data, the data are coded, redundancy is provided to the data. Thereby, in the error correction coding method, without providing additional information to a receiving side from the transmitting side, the receiving side detects, when decoding received data, an error of the data and thereby can correct the detected error. In the error correction coding method, an error correction ability increases as the size of redundant information added to coded data increases. An error correction method employed commonly by the terminal apparatus 1 and an opposite apparatus to be described later is, for example, a forward error correction (hereinafter, abbreviated as an "FEC method", and is referred to also as a "error correction coding method" or a "coding method").

The coding unit 7 can execute a plurality of types of error correction coding methods having error correction abilities different from each other. The coding unit 7 includes a coding processing function of coding a data set to be transmitted from the terminal apparatus 1 in accordance with coding processing based on any error correction coding method selected by a method to be described later among these error correction coding methods. In the following description, the data set to be transmitted from the terminal apparatus 1 may be referred to as coding target data (i.e., data to be coded).

The coding unit 7 codes coding target data to first coded data by a coding processing function. The coding unit 7 transmits the first coded data to the outside (an opposite apparatus to be described later).

The decoding unit 2 can execute the plurality of types of error correction coding methods having error correction abilities different from each other. The decoding unit 2 can select any error correction coding method to be executed selected by a method to be described later among these error correction coding methods. The decoding unit 2 includes a decoding processing function of decoding second coded data received by the terminal apparatus 1 from the outside in accordance with decoding processing based on the selected error correction coding method. In other words, the decoding unit 2 decodes the second coded data received in the terminal apparatus 1 by the decoding processing function.

The control unit 5 controls the coding processing function of the coding unit 7 and the decoding processing function of the decoding unit 2 described above and thereby can select individually any error correction coding method executed by the coding processing function and the decoding processing function among the plurality of types of error correction coding methods.

The control unit 5 controls the coding processing function of the coding unit 7 and the decoding processing function of the decoding unit 2 and controls individually the coding processing function and the decoding processing function on the basis of the selected error correction coding method.

Next, an operation of the present example embodiment will be described.

In the present example embodiment, it is assumed that the terminal apparatus 1 and an opposite apparatus that is not illustrated in FIG. 1 and including a configuration similar to the configuration of the terminal apparatus 1 as one example are transmittably/receivably connected to each other, and in the following, an operation of the terminal apparatus 1 in a state where the terminal apparatus 1 and the opposite apparatus are connected to each other will be described. In the present description, the opposite apparatus refers to a apparatus of a communication partner of the terminal apparatus 1.

The control unit 5 of the terminal apparatus 1 controls the coding processing function executed by the coding unit 7 and thereby codes coding target data including data representing a content to be described below. In other words, in the present example embodiment, the coding target data include at least the following elements a) to c):

a) a payload (i.e., data from the outside illustrated by a dotted line of a right arrow in FIG. 1) to be transmitted this time by the terminal apparatus 1 to an opposite apparatus, b) a number of error corrections (i.e., a first number of error corrections 3 illustrated in FIG. 1) indicating a number of times of error corrections counted when the decoding unit 2 of the terminal apparatus 1 decodes second encoded data already received from the opposite apparatus, and c) identifier information (i.e., coding method information 6 illustrated in FIG. 1), to be described later, for discriminating any error correction coding method selected by the control unit 5 to be employed for a payload to be transmitted next time to the opposite apparatus.

The control unit 5 controls the coding unit 7 to code coding target data (data to be transmitted to the opposite apparatus) including the above-described elements a) to c) in accordance with coding processing based on any selected error correction coding method to be executed this time and thereby generates first coded data.

In this manner, the coding unit 7 of the terminal apparatus 1 can transmit the first coded data to the opposite apparatus.

Identifier information described in the above-described element c) will be described. First, a second number of error corrections 4 as a basis of identifier information is described.

The second number of error corrections 4 is a number of error corrections indicating a number of times of error corrections of first coded data already received from the terminal apparatus 1 in the opposite apparatus, being counted by a decoding unit (not illustrated in FIG. 1) of the opposite apparatus when the decoding unit of the opposite apparatus decodes the first coded data. It is assumed that the decoding unit of the opposite apparatus includes a configuration similar to a configuration of the decoding unit 2 of the terminal apparatus 1.

The opposite apparatus includes a coding unit similar to the coding unit 7 of the terminal apparatus 1, and the coding unit (not illustrated in FIG. 1) of the opposite apparatus codes the second number of error corrections 4 as second coded data by including the second number of error corrections 4 in a data set to be transmitted. The opposite apparatus transmits the coded second coded data to the terminal apparatus 1.

The terminal apparatus 1 receives the second coded data transmitted from the opposite apparatus. The decoding unit 2 of the terminal apparatus 1 acquires, as a result of decoding the received second coded data by a method to be described later, the data set transmitted by the coding unit of the opposite apparatus. The decoding unit 2 takes out (extracts) the second number of error corrections 4 included in the acquired data set and transfers the taken-out number to the control unit 5. The second number of error corrections 4 is a value counted when the decoding unit of the opposite apparatus decodes first coded data received by the opposite apparatus from the terminal apparatus 1.

In the terminal apparatus 1, the control unit 5 executes the following processing on the basis of a number of times of error corrections indicated by the received second number of error corrections 4.

In other words, a type of an error correction coding method having an error correction ability capable of suppressing a number of times of error corrections indicated by the second number of error corrections 4 is selected. The control unit 5 identifies identifier information (coding method information 6) indicating the selected type of the error correction coding method.

As one example, the control unit 5 executes, when selecting a certain error correction coding method among a plurality of types of error correction coding methods upon transmitting first coded data, the following processing when the number of error corrections indicated by the second number of error corrections 4 counted by the decoding unit of the opposite apparatus is larger than 0. In other words, the control unit 5 selects an error correction coding method having an error correction ability that is higher than an error correction ability of the certain error correction coding method having been selected and causes the second number of error corrections 4 to be 0. The control unit 5 provides coding method information 6 indicating the selected error correction coding method to the coding unit 7. In response thereto, the coding unit 7 by executing coding processing based on any error correction coding method identified by the coding method information 6 for coding target data to be newly transmitted this time and generates first coded data to be newly transmitted this time to the opposite apparatus.

On the other hand, when newly receiving second coding data from the opposite apparatus in response to transmission of the first coded data by the terminal apparatus 1, the control unit 5 of the terminal apparatus 1 executes the following processing.

The control unit 5 controls the decoding unit 2 of the terminal apparatus 1 and decodes the newly received second coded data by decoding processing based on an error correction coding method indicated by identifier information included in a data set that is a decode result upon decoding, by the decoding unit 2, second coded data already received last time. The decoding unit 2 counts, when decoding the second coded data, a number of error corrections (i.e., a first number of error corrections 3 illustrated in FIG. 1) indicating a number of times of error corrections.

In this manner, the decoding unit 2 can restore the second coded data transmitted by the opposite apparatus to the terminal apparatus 1. A data set acquired by decoding the second coded data includes, similarly to the first coded data, at least the elements a) to c) described above.

The control unit 5 controls the coding unit 7 of the terminal apparatus 1, extracts a first number of error corrections 3 from the data set acquired as the decoding result of the second coded data, and controls the coding unit 7 as described above in such a way that the extracted first number of error corrections 3 is included in first coded data to be newly transmitted. In other words, when the decoding unit of the opposite apparatus decodes first coded data already received from the terminal apparatus 1 in the opposite apparatus, the coding unit of the opposite apparatus codes the data by including a second number of error corrections 4 counted by the decoding unit of the opposite apparatus and transmits the coded data to the terminal apparatus 1 as second coded data. The control unit 5 controls the decoding unit 2 of the terminal apparatus 1 to receive the second coded data and also extract the second number of error corrections 4 upon decoding. The control unit 5 selects, by the above-described method, any error correction coding method to be employed for a payload to be transmitted next time by the coding processing function of the terminal apparatus 1 according to the extracted second number of error corrections 4 among a plurality of types of error correction coding methods. The control unit 5 controls the coding unit 7 to generate first coded data to be transmitted next time including the payload (the element a)), the first number of error corrections 3 (the element b)), and coding method information (identifier information) 6 (the element c)) on the basis of the selected coding processing.

The terminal apparatus 1 illustrated in FIG. 1 may be achieved by dedicated hardware. The terminal apparatus 1 may be achieved by a storage medium storing a program and a computer such as a digital signal processor (DSP), a microprocessor, and the like that operates in accordance with the program stored on the storage medium.

As described above, in the present example embodiment, there is an advantageous effect in which an error correction coding method can be changed individually on a transmitting side and a receiving side by a simple configuration in such a way that an efficient and optimum transmission state is maintained even when transmission quality of a transmission path between terminal apparatuses changes.

The reason is that the terminal apparatus 1 acquires, in the terminal apparatus 1, a number of times of error corrections counted when an opposite apparatus decodes first coded data transmitted, by using second coded data, and thereby, in the terminal apparatus 1, can change an error correction coding method for coded data to be transmitted next time on the basis of the number of times of error corrections.

A number of times of error corrections counted when the terminal apparatus 1 decodes second coded data transmitted by the opposite apparatus is notified to the opposite apparatus by using the first coded data from the terminal apparatus, and in the opposite apparatus, an error correction coding method for data to be transmitted next time can be changed on the basis of the notified number of times of error corrections.

Second Example Embodiment

Next, a second example embodiment based on the first example embodiment of the present invention will be described. In the second example embodiment, an example in which the terminal apparatus 1 described in the first example embodiment is applied to a terminal apparatus disposed on the ground, for example, across a submarine cable will be described.

Figure 2A:
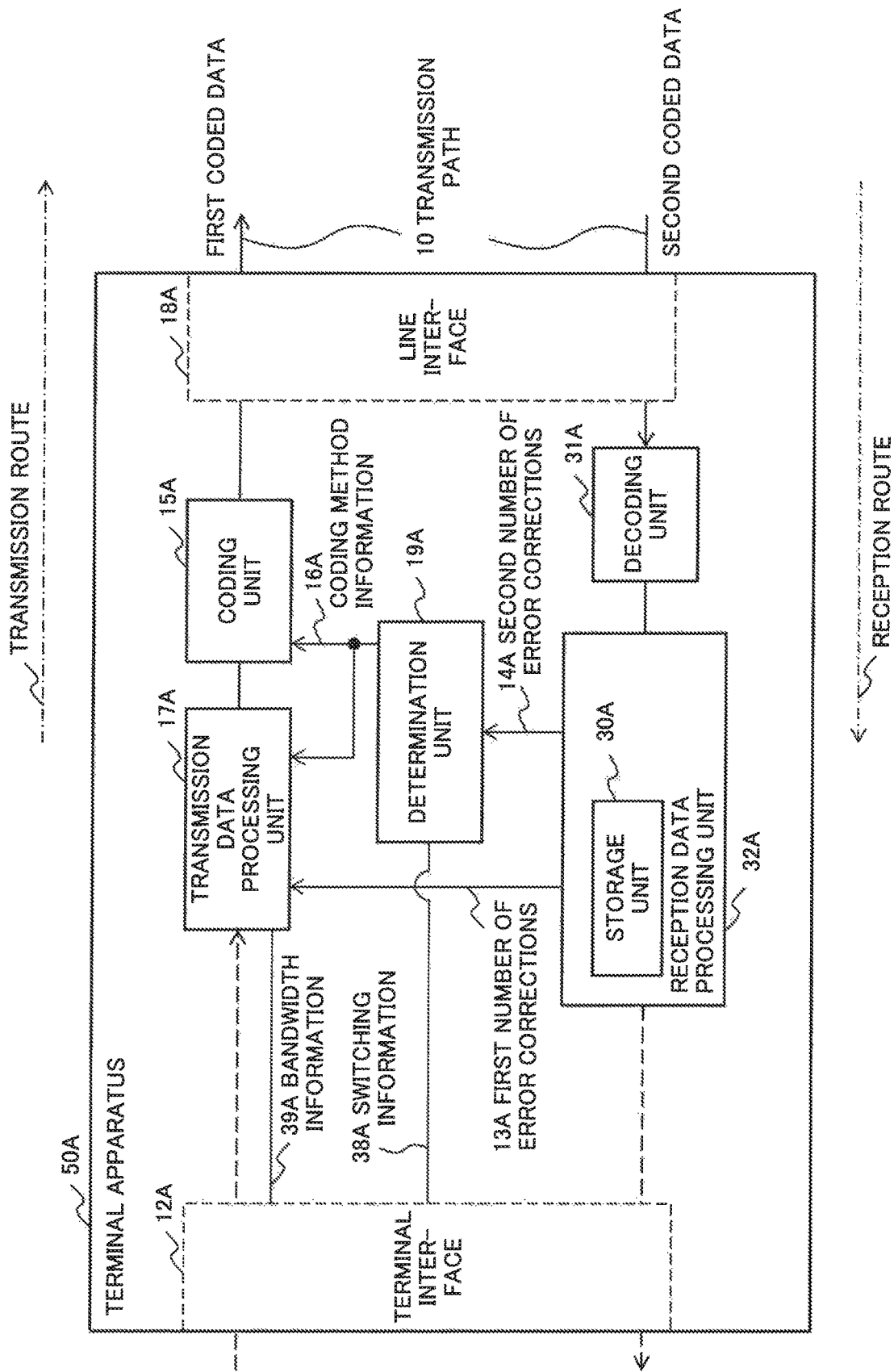
FIG. 2A is a block diagram illustrating a configuration of a terminal apparatus 50A according to a second example embodiment of the present invention.
Figure 2B:
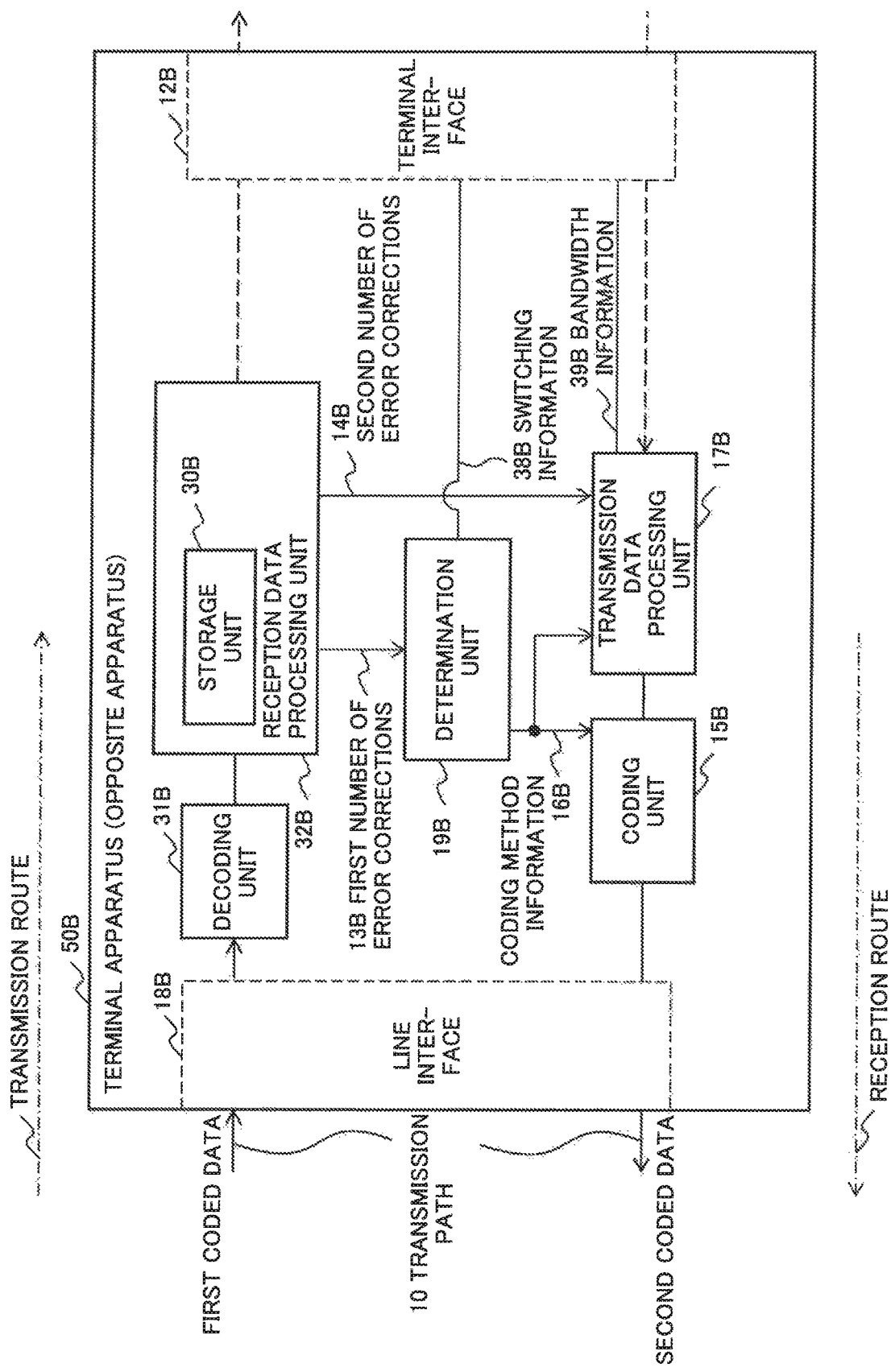
FIG. 2B is a block diagram illustrating a configuration of a terminal apparatus (opposite apparatus) 50B according to the second example embodiment of the present invention.

FIG. 2A is a block diagram illustrating a configuration of a terminal apparatus 50A according to the second example embodiment. FIG. 2B is a block diagram illustrating a configuration of a terminal apparatus 50B (opposite apparatus 50B) according to the second example embodiment. Referring to FIG. 2A, the terminal apparatus 50A includes a coding unit 15A, a transmission data processing unit 17A, a determination unit (control unit) 19A, a decoding unit 31A, a reception data processing unit 32A, a terminal interface 12A, and a line interface 18A. The reception data processing unit 32A includes a storage unit 30A. However, the storage unit 30A may be disposed in any place inside or outside of the terminal apparatus 50A as long as a storage content can be written in and referred to by the determination unit 19A.

Referring to FIG. 2B, the opposite apparatus 50B includes a coding unit 15B, a transmission data processing unit 17B, a determination unit (control unit) 19B, a decoding unit 31B, a reception data processing unit 32B, a terminal interface 12B, and a line interface 18B. The reception data processing unit 32B includes a storage unit 30B. However, the storage unit 30B may be disposed in any place inside or outside of the opposite apparatus 50B as long as a storage content can be written in and referred to by the determination unit 19B.

The terminal apparatus 50A is connected to the opposite apparatus 50B via a transmission path 10. The transmission path 10 is, for example, an optical communication cable.

The transmission path 10 configures a part of a transmission route where coded data (first coded data) to be transmitted are headed from the terminal apparatus 50A to the opposite apparatus 50B and a reception route where coded data (second coded data) to be received are headed from the opposite apparatus 50B to the terminal apparatus 50A.

A function of each unit configuring the terminal apparatus 50A and the opposite apparatus 50B described above will be described. Disposition (FIG. 2B) of each unit described above configuring the opposite apparatus 50B has a reverse relation with disposition (FIG. 2A) of each unit described above configuring the terminal apparatus 50A. Therefore, functions of the respective units of the terminal apparatus 50A and the opposite apparatus 50B are the same, and therefore a function of each unit configuring the terminal apparatus 50A will be mainly described, and description of a function of each unit configuring the opposite apparatus 50B overlapping with description of a function of each unit configuring the terminal apparatus 50A will be omitted.

The coding unit 15A and the transmission data processing unit 17A in the present example embodiment correspond to the coding unit 7 in the first example embodiment. The decoding unit 31A and the reception data processing unit 32A in the present example embodiment correspond to the decoding unit 2 in the first example embodiment. The determination unit 19A in the present example embodiment corresponds to the control unit 5 in the first example embodiment.

The coding unit 15A can execute coding processing based on a plurality of types of coding methods having error correction abilities different from each other.

The coding unit 15A codes a data set (coding target data) to be transmitted from the transmission data processing unit 17A to be described later by using coding processing based on any selected coding method among a plurality of types of coding methods and generates first coded data.

The transmission data processing unit 17A organizes the following respective elements as coding target data. In other words, the coding target data include, similarly to the above-described case of the first example embodiment, at least a payload (an element a)) to be transmitted to an opposite apparatus, a first number of error corrections 13A (an element b)), and coding method information 16A (an element c)).

The transmission data processing unit 17A receives, from the terminal interface 12A to be described later, data including at least a payload indicated in the element a) to be transmitted next time to the opposite apparatus 50B.

The transmission data processing unit 17A receives, from the reception data processing unit 32A, a first number of error corrections 13A indicated in the element b) indicating a number of times of error corrections counted when the decoding unit 31A of the terminal apparatus 50A decodes second coded data already received from the opposite apparatus 50B.

The transmission data processing unit 17A receives, from the determination unit 19A, coding method information 16A indicated in the element c) that is information for discriminating any error correction coding method selected by the determination unit 19A to be employed for a payload (an element a)) to be transmitted next time to the opposite apparatus 50B.

The coding method information 16A corresponds to the coding method information (identifier information) 6 in the first example embodiment. Details of the reception data processing unit 32A, the first number of error corrections 13A, and the determination unit 19A will be described later.

In this manner, the transmission data processing unit 17A generates a data set (coding target data) in which the payload to be transmitted is added with the first number of error corrections 13A and the coding method information 16A.

The coding unit 15A executes, for the generated data set, coding processing based on a coding method indicated by the coding method information 16A provided from the determination unit 19A and thereby generates first coded data. The first coded data are transmitted to the opposite apparatus 50B via the transmission path 10. A specific configuration example of the data set will be described later.

The decoding unit 31A receives second coded data.

The decoding unit 31A decodes the second coded data received this time by using decoding processing based on a coding method indicated by coding method information stored on the storage unit 30A included in the reception data processing unit 32A by a method to be described later. In other words, in the opposite apparatus 50B, the transmission data processing unit 17B notifies in advance the terminal apparatus 50A of information that specifies a coding method for coding a data set to be transmitted this time by coding method information included in a "next frame information" column (field) to be described later added to a data set of second coded data transmitted last time.

In the terminal apparatus 50A, the reception data processing unit 32A stores, when receiving the previous second coded data, the coding method information indicated by the "next frame information" column included in the received data set on the storage unit 30A as coding method information.

In this manner, the decoding unit 31A reads coding method information stored on the storage unit 30A when receiving current second coded data and decodes the current second coded data by decoding processing based on a coding method indicated by the read coding method information.

Therefore, the decoding unit 31A may use a previously determined coding method as a coding method used when decoding second coded data received first, for example, after activation of the terminal apparatus 50A. The coding unit 15A may use a previously determined coding method as a coding method used when coding first coded data to be transmitted first after activation of the terminal apparatus 50A.

The decoding unit 31A transfers a data set obtained as a result of decoding the second coded data to the reception data processing unit 32A.

The reception data processing unit 32A takes out data to be received by an information processing apparatus that is not illustrated and a second number of error corrections 14A to be described later from the data set received from the decoding unit 31A and transfers the taken-out data and number to each of the terminal interface 12A and the determination unit 19A.

The reception data processing unit 32A transfers, to the transmission data processing unit 17A, a first number of error corrections 13A indicating a number of times of error corrections of the received second coded data counted in the reception data processing unit 32A when the decoding unit 31A decodes the second coded data as described above. The first number of error corrections 13A is a type of piece of information representing a live situation (a latest state) of a transmission path over the entire reception route from transmission of second coded data from the opposite apparatus 50B to decoding of the data by the terminal apparatus 50A.

The determination unit 19A receives a second number of error corrections 14A from the reception data processing unit 32A as described above.

The second number of error corrections 14A is a number of times of error corrections of first coded data counted in the reception data processing unit 32B when the decoding unit 31B decodes the first coded data in the opposite apparatus 50B. In other words, the second number of error corrections 14A is a number indicated by a second number of error corrections 14B having returned to the terminal apparatus 50A via a reception route by being included in second coded data. The second number of error corrections 14A is a type of piece of information representing a live situation (a latest state) of a transmission path over the entire reception route from transmission of first coded data from the terminal apparatus 50A to decoding of the data by the opposite apparatus 50B.

The determination unit 19A takes out a second number of error corrections 14B added to a data set upon generating the second coded data in the opposite apparatus 50B from a data set obtained by decoding the second coded data in the terminal apparatus 50A and receives the taken-out number as the second number of error corrections 14A. In other words, the second number of error corrections 14A is based on the second number of error corrections 14B in the opposite apparatus 50B, and a content of the second number of error corrections 14A is the same as an original content of the second number of error corrections 14B.

In this manner, the terminal apparatus 50A can understand to what extent first coded data transmitted by the terminal apparatus 50A has been received in the opposite apparatus 50B by being subjected to error corrections, by a number of times of error corrections indicated by the second number of error corrections 14A included in second coded data.

The determination unit 19A selects a coding method having an error correction ability capable of suppressing a number of times of error corrections indicated by the second number of error corrections 14A as a coding method for coding first coded data to be transmitted next time by the terminal apparatus 50A among a plurality of types of coding methods in the coding unit 15A.

The determination unit 19A notifies, by coding method information 16A, the coding unit 15A of a new coding method selected by the above-described method.

The transmission data processing unit 17A stores the coding method notified by the coding method information 16A received from the determination unit 19A in a "next frame information" column added to a data set to be transmitted.

The opposite apparatus 50B includes each unit including the same function as the function of each unit configuring the terminal apparatus 50A described above. For example, the above-described determination unit 19B notifies, by coding method information 16B, the coding unit 15B of a new coding method selected by the above-described method.

A first number of error corrections 13B of the opposite apparatus is based on the first number of error corrections 13A in the terminal apparatus 50A, and a content of the first number of error corrections 13B is the same as an original content of the first number of error corrections 13A.

Next, the terminal interfaces 12A and 12B will be described. The terminal interfaces 12A and 12B are the same, and therefore the terminal interface 12A will be described and description on the terminal interface 12B will be omitted.

The terminal interface 12A is connected to an information processing apparatus such as a server and the like that is not illustrated in FIG. 2A. The terminal interface 12A receives signal light including, for example, local area network (LAN) data to be transmitted from the information processing apparatus. The terminal interface 12A causes the received signal light to be subjected to optical-electrical conversion and transfers data of the converted electrical signal to the transmission data processing unit 17A as data to be transmitted.

On the other hand, the terminal interface 12A receives, from the reception data processing unit 32A, data obtained as a result of decoding second coded data by the decoding unit 31A. The terminal interface 12A causes the received data to be subjected to electrical-optical conversion to a signal light including, for example, LAN data and transfers the signal light to an information processing apparatus that is not illustrated.

Next, the line interfaces 18A and 18B will be described. The line interfaces 18A and 18B are the same, and therefore the line interface 18A will be described and description on the line interface 18B will be omitted.

The line interface 18A converts first coded data output as an electrical signal from the coding unit 15A to a signal light and transmits the converted signal light to the opposite terminal apparatus 50B via the transmission path 10 including, for example, an optical fiber cable. On the other hand, the line interface 18A causes a signal light received from the terminal apparatus 50B via the transmission path 10 to be subjected to optical-electrical conversion and transfers second coded data converted to an electrical signal to the decoding unit 31A.

Types of coding methods used for the terminal apparatuses 50A and 50B will be described.

Figure 3:
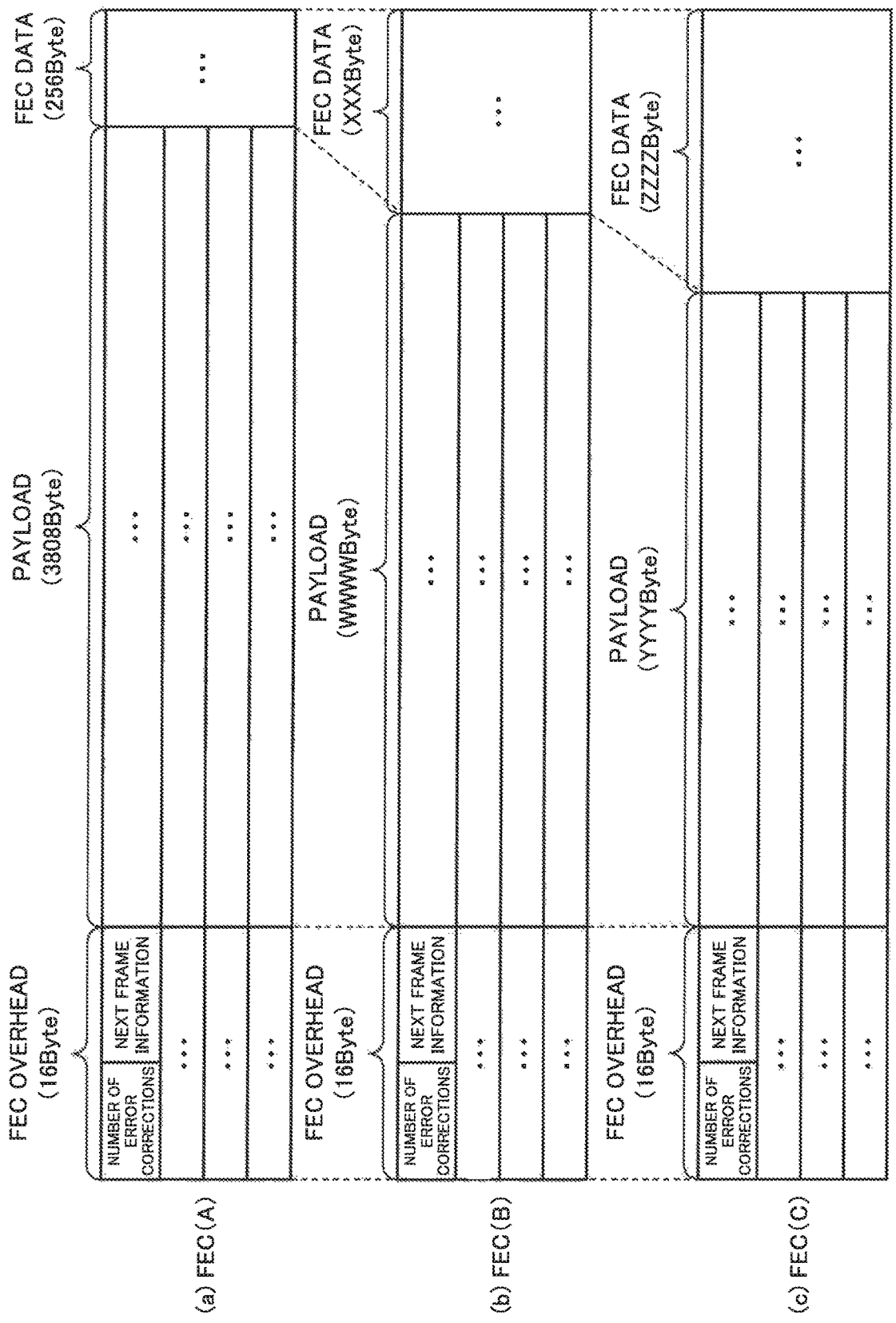
FIG. 3 is a diagram conceptually illustrating a configuration of a frame applied to the terminal apparatuses 50A and 50B in the second example embodiment.

FIG. 3 is a diagram conceptually illustrating a configuration (a data set and a frame) of coded data generated by a coding method applied to the terminal apparatuses 50A and 50B in the second example embodiment.

FIG. 3 is a diagram illustrating, as one example, a frame configuration of data applied to an optical transmission network conforming to G.709 recommended by Telecommunication Standardization Sector of International Telecommunication Union (ITU-T).

Symbols (a), (b), and (c) indicated in FIG. 3 indicate, as one example, frame configurations of coding methods FEC(A), FEC(B), and FEC(C) having error correction abilities different from each other, respectively.

Referring to each frame configuration illustrated in FIG. 3, a frame includes areas of an FEC overhead, a payload, and FEC data.

In the present example embodiment, the FEC overhead is further divided into a "number of error corrections" field and a "next frame information" field as one example. The "number of error corrections" field and the "next frame information" field will be described.

Hereinafter, in the terminal apparatus 50A, description will be made using an example of a data set configuring first coded data. A data set configuring second coded data is similar to a data set configuring first coded data, and therefore description thereof will be omitted.

The transmission data processing unit 17A stores a first number of error corrections 13A received from the reception data processing unit 32A in a "number of error corrections" field of a data set to be transmitted.

The transmission data processing unit 17A stores coding method information 16A received from the determination unit 19A in a "next frame information" field of a data set to be transmitted. Generation of the coding method information 16A stored will be described. The terminal apparatus 50A receives second coded data in which a second number of error corrections 14B counted when first coded data is decoded in the opposite apparatus 50B upon transmitting first coded data to the opposite apparatus 50B last time is transmitted by being included in a "number of error corrections" field of the second coded data. The terminal apparatus 50A transfers a second number of error corrections 14A included in the "number of error corrections" field of the received second coded data to the determination unit 19A. The determination unit 19A generates, on the basis of the transferred second number of error corrections 14A, coding method information 16A that determines a coding method capable of suppressing a second number of error corrections 14B in reception of next first coded data in the opposite apparatus 50B.

The terminal apparatus 50A codes, in the coding unit 15A, a data set generated in the transmission data processing unit 17A by using a coding method indicated by the above-described coding method information 16A and transmits the coded first coded data to the opposite apparatus 50B.

Description and explanation of a field other than the above-described two fields in the FEC overhead will be omitted.

A payload accommodates data transmitted/received to/from an information processing apparatus such as a server.

FEC data are used for correcting, upon detecting an error in first coded data when, for example, the decoding unit 31B of the terminal apparatus 50B decodes first coded data, the detected error in the decoding unit 31B.

In the present example embodiment, in a logic circuit and a work area including a memory that are not illustrated in the transmission data processing unit 17A and the reception data processing unit 32A, the following frame generation processing and frame decomposition processing are executed.

In other words, the above-described transmission data processing unit 17A generates, in a frame unit indicated in (a) to (c) in FIG. 3, a frame in which data to be transmitted are converted to coded data. The reception data processing unit 32A decodes received coded data in a frame unit indicated in (a) to (c) in FIG. 3 and executes frame decomposition for converting the decoded data to data to be received.

The transmission data processing unit 17A in the present example embodiment switches a coding method as described below when data to be transmitted are coded by the coding unit 15A by using a coding method selected by the determination unit 19A, the method being different from a previous coding method as necessary. In other words, the above-described transmission data processing unit 17A and coding unit 15A repeat an operation procedure to be described later in the present example embodiment and thereby can always use coding processing based on an optimum error correction coding method. In other words, the terminal apparatus 50A according to the present example embodiment can perform switching in real time and dynamically to coding processing based on an optimum error correction coding method for each frame configuration including a payload to be transmitted to the opposite apparatus 50B.

The reception data processing unit 32A in the present example embodiment switches a coding method as described below when second coded data are decoded using a coding method stored on the storage unit 30A, the method being different from a previous coding method as necessary. In other words, the above-described decoding unit 31A and reception data processing unit 32A repeat an operation procedure to be described later in the present example embodiment and thereby can always use decoding processing based on an optimum error correction coding method. In other words, the terminal apparatus 50A according to the present example embodiment can perform switching in real time and dynamically to decoding processing based on an optimum error correction coding method for each frame configuration including a payload to be received from the opposite apparatus 50B.

Next, an operation of the present example embodiment will be described. First, a content of a "next frame information" field and an operation of each unit after power supply to the terminal apparatus 50A and the opposite apparatus 50B is described below.

First, the terminal apparatus 50A is described.

When the terminal apparatus 50A is powered on and started, the determination unit 19A has stored, as an initial value, for example, an FEC(B) that is a coding method applied to a data set to be transmitted first. The determination unit 19A stores the FEC (B) in a "next frame information" field of the coding unit 15A and codes a data set in the coding unit 15A by using the FEC(B) as a coding method for coding a data set itself to be transmitted first.

A coding method for coding a data set itself to be transmitted next time and later may be a coding method other than the FEC(B) stored on the transmission data processing unit 17A as described later. In this manner, the terminal apparatus 50A transmits coded first coded data to the opposite apparatus 50B.

Next, the opposite apparatus 50B is described.

The decoding unit 31B has stored, as an initial value, for example, an FEC(B) that is a coding method used when decoding first coded data received first.

The decoding unit 31B of the opposite apparatus 50B decodes first coded data received first by using the FEC(B) previously stored. The reception data processing unit 32B stores, on the storage unit 30B, a coding method for coding first coded data to be received next time stored in "next frame information" in a decoded data set. In this manner, the opposite apparatus 50B can decode first coded data to be transmitted next time and later from the terminal apparatus 50A.

A coding method used upon decoding in the decoding unit 31B first after being started may be stored, for example, on the storage unit 30B, and in this case, the decoding unit 31B may receive an FEC(B) from the storage unit 30B.

The above-described transmission/reception operation of first coded data from the coding unit 15A to the decoding unit 31B is similar to a transmission/reception operation of second coded data from the coding unit 15B to the decoding unit 31A.

When in the terminal apparatus 50A, a coding method does not need to be switched since, for example, there is no failure and the like in the transmission path 10 and a data error is not generated in first coded data, in the terminal apparatus 50A, for example, the above-described FEC(B) is stored in "next frame information", the FEC(B) is applied to coding of a data set itself, and first coded data is transmitted from the coding unit 15A.

Switching of "next frame information" when on the other hand, in the terminal apparatus 50A, for example, a failure and the like is generated in the transmission path 10, a data error in first coded data transmitted next time by the terminal apparatus 50A is generated in the opposite apparatus 50B, and a coding method needs to be switched in the terminal apparatus 50A is described below.

The opposite apparatus 50B transmits, to the terminal apparatus 50A, a second number of error corrections 14B that is a number of times of error corrections in the opposite apparatus 50B with respect to first coded data transmitted by the terminal apparatus 50A by being included in an "number of error corrections" field of second coded data from the opposite apparatus 50B.

The decoding unit 31A of the terminal apparatus 50A decodes the received second coded data by the above-described decoding method. The reception data processing unit 32A takes out a number of error corrections 14A from the "number of error corrections" field in the decoded data set and transfers the taken-out number to the determination unit 19A.

The determination unit 19A determines a coding method capable of suppressing a number of error corrections indicated by the received second number of error corrections 14A. It is assumed that the determination unit 19A has selected, for example, an FEC(C).

The determination unit 19A stores the FEC(C) in a "next frame information" field of the coding unit 15A. The transmission data processing unit 17A codes a data set in the coding unit 15A by using, as a coding method for coding a data set itself to be transmitted next time, the coding method FEC(B) stored on the transmission data processing unit 17A and used upon the previous (first) transmission.

The transmission data processing unit 17A codes a data set itself storing the FEC(C) in the "next frame information" by the coding method FEC(B) and transmits the coded data set to the opposite apparatus B as first coded data.

The opposite apparatus B decodes the first coded data received this time by using the coding method FEC(B) included in "next frame information" of a data set of first coded data received last time stored on the storage unit 30B.

The reception data processing unit 32B takes out "next frame information" from a data set obtained as a result of decoding the first coded data received this time and stores, on the storage unit 30B, an FEC(C), included in the taken-out "next frame information" and used for coding first coded data to be received next time.

In this manner, the reception data processing unit 32B can decode the first coded data to be received next time by the FEC(C) that is a coding method stored on the storage unit 30B.

Figure 4A:
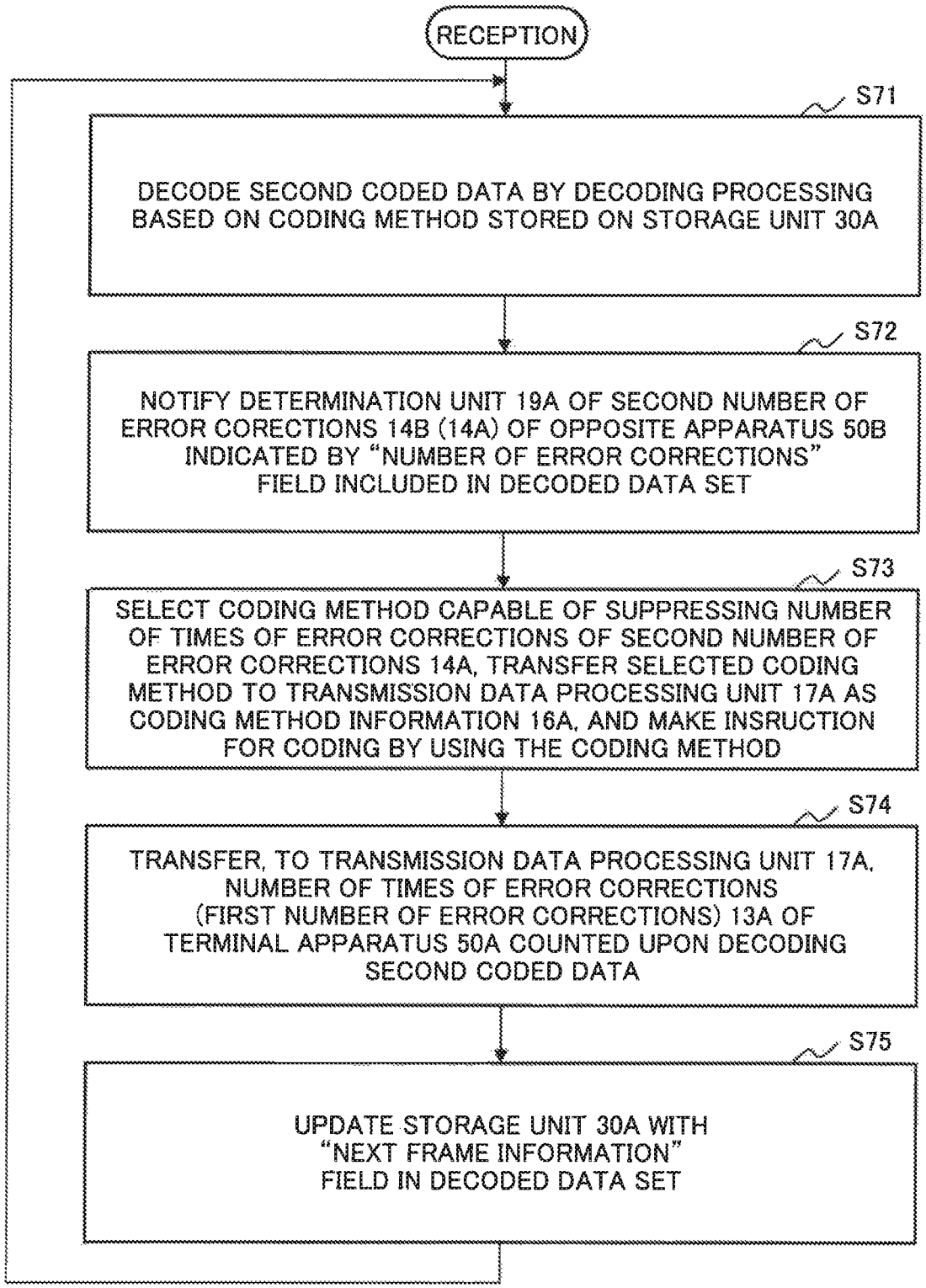
FIG. 4A is a flowchart illustrating a flow of reception processing of the terminal apparatuses 50A and 50B in the second example embodiment.
Figure 4B:
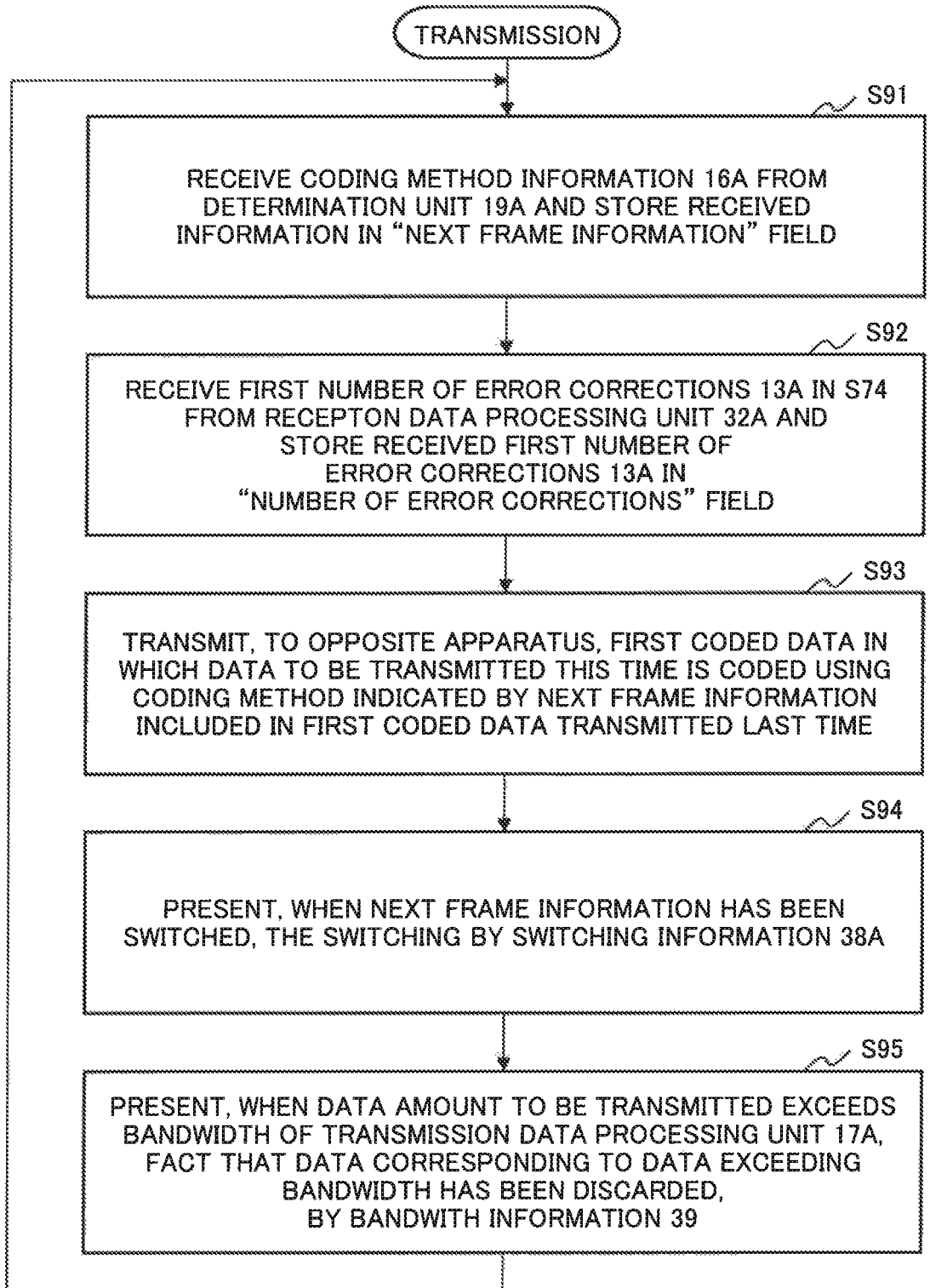
FIG. 4B is a flowchart illustrating a flow of transmission processing of the terminal apparatuses 50A and 50B in the second example embodiment.

FIG. 4A and FIG. 4B are flowcharts illustrating flows of reception processing and transmission processing executed by the terminal apparatuses 50A and 50B, respectively, in the present example embodiment. In the following operation description, the terminal apparatus 50A is mainly described. An operation of the opposite apparatus 50B including substantially the same configuration as the configuration of the terminal apparatus 50A is substantially the same as an operation of the terminal apparatus 50A, and therefore operation description of the opposite apparatus 50B overlapping with operation description of the terminal apparatus 50A will be omitted. First, the reception processing illustrated in FIG. 4A is described.

In the terminal apparatus 50A, the decoding unit 31A decodes second coded data received from the opposite apparatus 50B by decoding processing based on a coding method stored on the storage unit 30A (step S71).

In the terminal apparatus 50A, the storage unit 30A stores a value indicated by a "next frame information" field included in second coded data received last time from the opposite apparatus 50A and used for decoding second coded data to be received next time from the opposite apparatus 50B.

The decoding unit 31A decodes the second coded data received by the terminal apparatus 50A. The reception data processing unit 32A acquires (extracts) a value of a "number of error corrections" field included in a data set obtained as the result. The reception data processing unit 32A notifies the determination unit 19A, as a second number of error corrections 14A, of a number of error corrections (a second number of error corrections) 14B of the opposite apparatus 50B stored in the "number of error corrections" field and counted in the reception data processing unit 32B of the opposite apparatus 50B (step S72).

The determination unit 19A selects a type of a coding method having an error correction ability capable of suppressing a number of error corrections indicated by the second number of error corrections 14A received from the reception data processing unit 32A by coding data to be transmitted next time by the transmission data processing unit 17A. The determination unit 19A transfers the selected coding method to the transmission data processing unit 17A as coding method information (next frame information) 16A. The determination unit 19A makes an instruction for coding data to be transmitted, using the coding method transferred to the transmission data processing unit 17A (step S73).

The reception data processing unit 32A transfers a number of error corrections (a first number of error corrections) 13A of the terminal apparatus 50A counted upon decoding the second coded data to the transmission data processing unit 17A (step S74).

In the terminal apparatus 50A, the reception data processing unit 32A updates a storage content stored on the storage unit 30A with information indicating a coding method indicated by a "next frame information" field in a data set obtained as a result of decoding executed by the decoding unit 31A (step S75).

A type of an FEC method selected by the determination unit 19A in step S73 is described below.

FEC methods defined by G.975 and G.975.1 in the above-described ITU-T recommendations are an Reed-Solomon (RS) coding method and a Bose-Chaudhuri-Hocquenghem (BCH) coding method, respectively.

In the present example embodiment, as one example, used is a coding method in which an RS coding method, a BCH coding method, and a BCH coding method are continuously connected (coding of two coding methods is continuously executed) in order of (a) FEC(A), (b) FEC(B), and (c) FEC(C) illustrated in FIG. 3.

It is assumed that in the above-described coding methods, a coding gain (i.e., an ability of correcting an error) increases in the above-described order.

A size of each FEC frame in (a) to (c) illustrated in FIG. 3 is, as one example, 4080 Bytes in a column (horizontal) direction and four lines in a line (vertical) direction in the present example embodiment.

A size of each area configuring the frame of (a) FEC(A) illustrated in FIG. 3 is, as one example, 16 Bytes as an FEC overhead, 3808 Bytes as a payload, and 256 Bytes as FEC data. The above-described size of each area is one example and is not limited to the above-described size.

As a gain of an FEC method increases, a size of FEC data increases and a payload decreases thereby, and therefore transmission efficiency of data decreases and a bandwidth indicating a data amount transmittable in a unit time decreases. In other words, there is a reciprocal relationship between a gain of an FEC method and a bandwidth. As a gain of an FEC method increases, a processing load upon coding and decoding in a transmission data processing unit and a reception data processing unit increases, and therefore a processing delay occurs and power consumption increases due to a large processing load.

A method for selecting, by the determination unit 19A of the terminal apparatus 50A in step S73, a coding method having an error correction ability capable of suppressing a size of a second number of error corrections 14A counted in the opposite apparatus 50B will be described.

Figure 5:
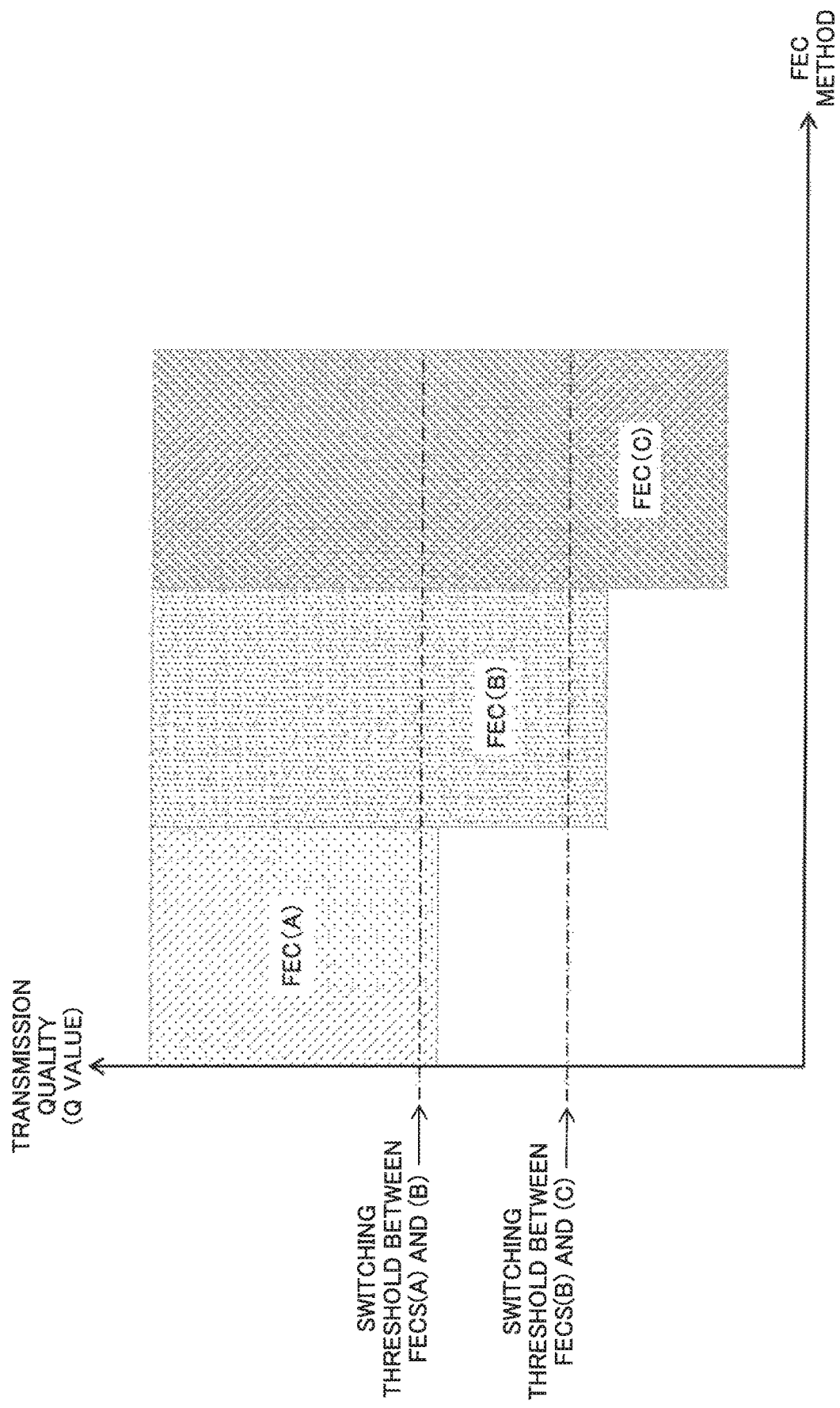
FIG. 5 is a diagram illustrating a switching threshold of an FEC method in the second example embodiment.

FIG. 5 is a diagram illustrating a switching threshold of an FEC method in the present example embodiment.

The vertical axis of a graph illustrated in FIG. 5 represents transmission quality (quality (Q) value) in the transmission path 10. The Q value has, as one example, a negative correlation with a number of error corrections indicated by a number of error corrections (a second number of error corrections 14B) of the opposite apparatus 50B counted in the reception data processing unit 32B when the decoding unit 31B of the opposite apparatus 50B decodes first coded data.

More specifically, the Q value is an indicator representing quality of a digital signal transmitted/received in the transmission path 10. The Q value is an indicator corresponding to an SNR (signal-to-noise-ratio; SN ratio) in an electrical signal when the decoding unit 31B decodes first coded data received from the terminal apparatus 50A and discriminates a logic "1" and a logic "0" of the decoded data.

A unit of the vertical axis in the graph illustrated in FIG. 5 is, for example, decibel (dB). An upper direction indicated by an arrow of the vertical axis indicates that a Q value is relatively large, i.e., indicates that transmission quality of the transmission path 10 is excellent and therefore a number of error corrections in the reception data processing unit 32B of the opposite apparatus 50B is small. In other words, it can be said that as a number of error correction becomes smaller, a Q value becomes larger.

In the vertical axis in the graph illustrated in FIG. 5, as one example, two switching thresholds that are a switching threshold between FECs (A) and (B) and a switching threshold between FECs (B) and (C) are illustrated.

On the other hand, in a right direction indicated by an arrow of the horizontal axis in the graph illustrated in FIG. 5, three types of FEC methods of the FEC(A), the FEC(B), and the FEC(C) described using FIG. 3 are arranged in order from an FEC method having a low error correction ability to an FEC method having a high error correction ability.

One example of a setting method for a switching threshold upon switching each FEC method described above is as follows.

In other words, a switching threshold between the FEC (A) and the FEC(B) is set at a Q value slightly (e.g., by a margin of approximately 1 dB) larger than a Q value indicating a lower limit value of an error correction ability of the FEC(A) (i.e., a lower end of the FEC(A)).

A switching threshold between the FEC(B) and the FEC (C) is set at a Q value larger than a Q value indicating a lower limit value of an error correction ability of the FEC(B) (i.e., a lower end of the FEC(B)) by a value larger than the above-described margin (e.g., by a margin of approximately 3 dB).

In the present example embodiment, as described above, for a switching threshold of an FEC method having a higher error correction ability, a margin is set in such a way as to more largely exceed a Q value indicating a lower limit value of the error correction ability. The reason is that an error change in a vicinity of a Q value indicating a lower limit value of an error correction ability is rapid in an FEC method having a higher error correction ability.

One example of a selection method upon selecting an FEC method by the determination unit 19A is as follows.

In other words, the determination unit 19A refers to a table (conversion information) representing, for example, the thresholds illustrated in FIG. 5 on the basis of a second number of error corrections 14A extracted from a data set obtained by decoding second coded data received from the opposite apparatus 50B and converts the second number of error corrections 14A to a Q value. The determination unit 19A selects the FEC(A) when the converted value is larger than the switching threshold between the FECs (A) and (B).

The determination unit 19A converts the second number of error corrections 14A to a Q value on the basis of the received second number of error corrections 14A. The determination unit 19A selects the FEC(B) when the converted value is lower than the switching threshold between the FECs(A) and (B) and larger than the switching threshold between the FECs(B) and (C).

The determination unit 19A converts the second number of error corrections 14A to a Q value on the basis of the received second number of error corrections 14A. The determination unit 19A selects the FEC method (C) when the converted value is lower than the switching threshold between the FECs(B) and (C) and larger than a lower limit of the error correction ability of FEC(C) by a predetermined margin.

The determination unit 19A outputs the FEC method selected by the above-described method to the transmission data processing unit 17A as coding method information (next frame information) 16A.

The determination unit 19A may cause the above-described threshold of a Q value upon selecting the above-described coding method to be adjustable.

Subsequently, transmission processing illustrated in FIG. 4B will be described.

In the terminal apparatus 50A, the transmission data processing unit 17A receives the coding method information 16A from the determination unit 19A in the above-described reception processing (step S73). The transmission data processing unit 17A stores coding method information indicated by the coding method information 16A in a "next frame information" field included in a data set to be transmitted by the transmission data processing unit 17A (step S91).

The transmission data processing unit 17A receives the number of error corrections (the first number of error corrections 13A) transferred from the reception data processing unit 32A in the above-described reception processing (step S74).

The transmission data processing unit 17A stores the received number of error corrections (the first number of error corrections 13A) in a "number of error corrections" field included in a data set to be transmitted by the transmission data processing unit 17A (step S92).

The coding unit 15A transmits, to the opposite apparatus 50B, first coded data in which the data set to be transmitted this time is coded using a coding method indicated by coding method information 16A (next frame information) included in a frame of first coded data transmitted last time (step S93).

The determination unit 19A presents, to the outside, switching information 38A indicating that switching to an FEC method different from a previous method has been performed according to a change of a line situation, when the coding method information 16A (next frame information) has been switched (step S94).

In the transmission data processing unit 17A, due to a change of an FEC method in step S94, a data amount of data to be transmitted received from the terminal interface 12A may exceed a bandwidth of the transmission data processing unit 17A. In this case, the transmission data processing unit 17A presents, to the outside, bandwidth information 39A indicating that pieces of data received from the terminal interface 12A corresponding to pieces of data exceeding the bandwidth of the transmission data processing unit 17A are discarded among pieces of data to be transmitted (step S95).

In the present example embodiment, decoding of second coded data, for example, in step S71 of the above-described reception processing illustrated in FIG. 4A and coding of first coded data, for example, in step S93 of the transmission processing illustrated in FIG. 4B can be synchronously executed.

The reception data processing unit 32A, the transmission data processing unit 17A, and the determination unit 19A in the terminal apparatus 50A illustrated in FIG. 2A may be achieved by dedicated hardware. The reception data processing unit 32A, the transmission data processing unit 17A, and the determination unit 19A may be achieved, for example, by a storage medium storing a program and a computer such as a DSP, a microcomputer, and the like that operates in accordance with the program stored on the storage medium. The above-described configuration of the terminal apparatus 50A in FIG. 2A is similar to a configuration of the terminal apparatus 50B illustrated in FIG. 2B.

As described above, in the present example embodiment, similarly to the first example embodiment, there is an advantageous effect in which an error correction coding method can be changed individually on a transmitting side and a receiving side by a simple configuration in such a way that an efficient and optimum transmission state is maintained even when transmission quality of a transmission path between terminal apparatuses changes.

The reason is that a number of times of error corrections in an opposite apparatus of first coded data transmitted by a terminal apparatus is notified to the terminal apparatus by being included in second coded data from the opposite apparatus and in the terminal apparatus, an error correction coding method for data to be transmitted next time is changed on the basis of the notified number of times of error corrections.

A number of times of error corrections in the terminal apparatus of second coded data transmitted by the opposite apparatus is notified to the opposite apparatus by being included in first coded data from the terminal apparatus, and in the opposite apparatus, an error correction coding method for data to be transmitted next time is changed on the basis of the notified number of error corrections.

The present example embodiment may be applied to a land terminal apparatus that relays a communicable land cable and a wireless terminal used for wireless communication such as satellite communication, land wireless communication, and the like using digital microwaves or the like, other than a submarine terminal apparatus.

Hardware Configuration Example

A configuration example of hardware resources in which the above-described terminal apparatus in each example embodiment of the present invention is achieved using a computer such as an information processing apparatus will be described. However, the terminal apparatus may be achieved as a dedicated apparatus.

FIG. 6 is a diagram schematically illustrating a hardware configuration of an information processing apparatus capable of achieving the terminal apparatuses according to the first example embodiment of the present invention and the second example embodiment of the present invention. An information processing apparatus 60 includes a central processing unit (hereinafter, abbreviated as a "CPU") 61, a memory 62, a disc 63, a reading apparatus 64 of a nonvolatile recording medium, a communication line 65, an interface 67, an output apparatus 66, and an input apparatus 68.

The reading apparatus 64 of a nonvolatile recording medium refers to, for example, a compact disc, a digital versatile disc, a Blue-ray (a registered trademark) disc, and a universal serial bus (USB) memory that are computer-readable, stores the program without power supply, and causes the program to be portable. The media readable by the reading apparatus 64 of a nonvolatile recording medium are not limited to the above-described media. For introduction of a program from the outside, the program may be read/written via the communication line 65 that is communicable, instead of the reading apparatus 64 of a nonvolatile medium. The interface 67 is connected to another information processing apparatus such as an external server, for example, as the terminal interfaces 12A and 12B illustrated in FIG. 2A and FIG. 2B. The interface 67 is connected to the transmission path 10, for example, as the line interfaces 18A and 18B illustrated in FIG. 2A and FIG. 2B.

The CPU 61 copies, when executing a software program (computer program: hereinafter, referred to simply as a "program") stored on the disc 63, the program onto the memory 62 and executes arithmetic processing. The CPU 61 reads data necessary for program execution from the memory 62. When display is necessary, the CPU 61 displays an output result on the output apparatus 66. The CPU 61 can display, for example, switching information 38A and switching information 38B and bandwidth information 39A and bandwidth information 39B on the output apparatus 66.

The CPU 61 can update a switching threshold for switching an FEC method changed, for example, by the input apparatus 68 and display the updated result on the output apparatus 66. The CPU 61 interprets and executes a terminal apparatus control program (FIG. 4A, FIG. 4B, and the like) existing on the memory 62 corresponding to the above-described function (processing) represented by each unit illustrated in FIG. 1, FIG. 2A. and FIG. 2B. The CPU 61 sequentially executes the above-described processing described in each example embodiment of the present invention.

In other words, in such a case, it is conceivable that the present invention can be achieved by the terminal apparatus control program. It is conceivable that the present invention can be achieved also by a computer-readable recording medium recording the terminal apparatus control program.

As described above, the present invention has been described using the above-described typical example embodiments as examples. However, the technical scope of the present invention is not limited to the above-described scope described in each example embodiment. It is apparent to those skilled in the art that the example embodiment can be subjected to various modifications or improvements. In such a case, a new example embodiment added with the modifications or improvements is also included in the technical scope of the present invention.

This application is based upon and claims the benefit of priority from Japanese patent application No. 2015-183657, filed on Sep. 17, 2015, the disclosure of which is incorporated herein in its entirety by reference.

REFERENCE SIGNS LIST

1 Terminal apparatus
2 Decoding unit
3 First number of error corrections
4 Second number of error corrections
5 Control unit
6 Coding method information
7 Coding unit
10 Transmission path
12A, 12B Terminal interface
13A, 13B First number of error corrections
14A, 14B Second number of error corrections
15A, 15B Coding unit
16A, 16B Coding method information
17A, 17B Transmission data processing unit
18A, 18B Line interface
19A, 19B Determination unit
30A, 30B Storage unit
31A, 31B Decoding unit
32A, 32B Reception data processing unit
38A, 38B Switching information
39A, 39B Bandwidth information
50A, 50B Terminal apparatus

What is claimed is:

1. A terminal apparatus comprising:
a coding unit configured to generate first coded data by executing coding processing of coding target data based on a first method among a plurality of types of error correction methods having error correction abilities different from one another, and transmit the first coded data to an opposite apparatus;
a decoding unit configured to receive second coded data from the opposite apparatus and decode the second coded data based on a second method among the plurality of types of error correction methods; and
a control unit configured to individually select the first method and the second method among the plurality of types of error correction methods, and control the coding unit and the decoding unit,
wherein the coding target data comprises
a payload to be transmitted,
a first number of error corrections indicating a number of error corrections counted when the decoding unit of the terminal apparatus decodes the second coded data, and
first identifier information of the first method, to be employed for the payload,
wherein the decoding unit is further configured to decode the second coded data based on second identifier information received from the opposite apparatus and extract information of a second number of error corrections from the opposite apparatus, the second number of error corrections being a value counted when a second decoding unit of the opposite apparatus decodes the first coded data, and
wherein the control unit is further configured to select the first method based on the information of the second number of error corrections.

2. The terminal apparatus according to claim 1, wherein the control unit is further configured to control the decoding unit to store, in a storage unit, the second identifier information included in a data set acquired upon decoding the received second coded data, and decode another second decoded data to be received by the terminal apparatus, by decoding processing based on one of the plurality of types of error correction methods indicated by the second identifier information stored in the storage unit.

3. The terminal apparatus according to claim 1, wherein the control unit is further configured to control the coding unit to select the first method among the plurality of types of error correction methods having a higher error correction ability as the second number of error corrections included in a data set acquired upon decoding the received second coded data becomes larger, and generate another first coded data to be transmitted, by coding processing based on the first method.

4. The terminal apparatus according to claim 1, wherein the coding unit further comprises a transmission data processing unit,
wherein the transmission data processing unit is configured to generate a data set including at least one of the payload, the first number of error corrections, and the first identifier information, and
wherein the coding unit is further configured to code the data set to the first coded data in accordance with coding processing based on the error correction method indicated by the first identifier information.

5. The terminal apparatus according to claim 1, wherein the second coded data includes at least one of a second payload, the second number of error corrections, and the second identifier information,
wherein the decoding unit further comprises a reception data processing unit configured to extract the second payload rom a data set generated by the decoding unit and outputs the extracted second payload, and
wherein the decoding unit is further configured to decode the second coded data by decoding processing based on the second methods among the plurality of types of error correction methods indicated by the control unit.

6. The terminal apparatus according to claim 4, wherein the control unit is further configured to convert the second number of error corrections from the opposite apparatus into a Q value indicating a transmission quality between the terminal apparatus and the opposite apparatus, and
wherein the control unit is further configured to select one of the plurality of types of error correction methods to correct an error generated in the converted Q value, and provide, as the identifier information, the selected type of the error correction method for the opposite apparatus by using the first coded data.

7. The terminal apparatus according to claim 6, wherein the control unit is further configured to increase a predetermined margin value when setting a switching threshold of the error correction method to the Q value exceeding the Q value corresponding to a lower limit value of an error correction ability based on the error correction method by a predetermined margin value, the predetermined margin value indicating the error correction method having a higher error correction ability.

8. The terminal apparatus according to claim 7, wherein the plurality of error correction methods are error correction methods in accordance with a forward error correction (FEC) method, and
wherein the first coded data and the second coded data include a data configuration conforming to G.709 based on Telecommunication Standardization Sector of International Telecommunication Union (ITU-T).

9. A control method for a terminal apparatus, the method comprising:
generating, by a coding unit, first coded data by executing coding processing of coding target data based on a first method among a plurality of types of error correction methods having error correction abilities different from one another, and transmitting the first coded data to an opposite apparatus;
receiving, by a decoding unit, second coded data from the opposite apparatus and decoding the second coded data based on a second method among the plurality of types of error correction methods,
individually selecting the first method and the second method among the plurality of types of error correction methods,
wherein the coding target data comprises
a payload to be transmitted,
a first number of error corrections indicating a number of error corrections counted when the decoding unit of the terminal apparatus decodes the second coded data, and
first identifier information of the first method, to be employed for the payload,
wherein the decoding further comprises decoding the second coded data based on second identifier information received from the opposite apparatus and extracting information of a second number of error corrections from the opposite apparatus, the second number of error corrections being a value counted when a second decoding unit of the opposite apparatus decides the first coded data, and
wherein the selecting further comprises selecting the first method based on the information of the second number of error corrections.

10. A non-transitory recording medium storing a control program of a terminal apparatus, the control program executing instructions to:
generate, by a coding unit, first coded data by executing coding processing of coding target data based on a first method among a plurality of types of error correction methods having error correction abilities different from one another, and transmit the first coded data to an opposite apparatus;
receive, by a decoding unit, second coded data from the opposite side apparatus and decode the second coded based on a second method among the plurality of types of error correction methods,
individually select the first method and the second method among the plurality of types of error correction methods,
wherein the coding target data comprises:
a payload to be transmitted,
a first number of error corrections indicating a number of error corrections counted when the decoding unit of the terminal apparatus decodes the second coded data, and
first identifier information of the first method, to be employed for the payload,
wherein the decoding further comprises the second coded data based on second identifier information received from the opposite apparatus, and extracting information of a second number of error corrections from the opposite apparatus, the second number of error corrections being a value counted when a second decoding unit of the opposite apparatus decides the first coded data, and
wherein the selecting further comprises selecting the first method based on the information of the second number of error corrections.

* * * * *